(12) United States Patent
Tay et al.

(10) Patent No.: US 10,779,415 B2
(45) Date of Patent: Sep. 15, 2020

(54) COMPONENT EMBEDDING IN THINNER CORE USING DIELECTRIC SHEET

(71) Applicant: AT&S (China) Co. Ltd., Shanghai (CN)

(72) Inventors: Annie Tay, Singapore (SG); Mikael Tuominen, Shanghai (CN)

(73) Assignee: AT&S (China) Co. Ltd., Shanghai (CN)

( * ) Notice: Subject to any disclaimer, the term of this patent is extended or adjusted under 35 U.S.C. 154(b) by 92 days.

(21) Appl. No.: 16/090,222

(22) PCT Filed: Mar. 29, 2017

(86) PCT No.: PCT/IB2017/051794
§ 371 (c)(1),
(2) Date: Sep. 29, 2018

(87) PCT Pub. No.: WO2017/168342
PCT Pub. Date: Oct. 5, 2017

(65) Prior Publication Data
US 2019/0116671 A1 Apr. 18, 2019

(30) Foreign Application Priority Data
Mar. 31, 2016 (CN) .......................... 2016 1 0196443

(51) Int. Cl.
*H05K 1/18* (2006.01)
*H05K 1/02* (2006.01)
*H05K 3/46* (2006.01)

(52) U.S. Cl.
CPC ........... *H05K 1/188* (2013.01); *H05K 1/0231* (2013.01); *H05K 1/0298* (2013.01); *H05K 1/185* (2013.01);
(Continued)

(58) Field of Classification Search
CPC .... H05K 1/188; H05K 1/0231; H05K 1/0298; H05K 3/4611; H05K 3/4602
(Continued)

(56) References Cited

U.S. PATENT DOCUMENTS

| 5,919,329 A | * | 7/1999 | Banks | .................. H01L 21/486 156/281 |
| 7,923,367 B2 | * | 4/2011 | Machida | ................. H01L 23/13 438/637 |

(Continued)

FOREIGN PATENT DOCUMENTS

| CN | 101 594 740 A | 12/2009 |
| CN | 103188882 A | 7/2013 |

(Continued)

OTHER PUBLICATIONS

The State Intellectual Property Office of P.R. of China, Office Action in Application No. 201610196443.1, dated Dec. 29, 2018, pp. 1-9.
(Continued)

*Primary Examiner* — Andargie M Aychillhum
(74) *Attorney, Agent, or Firm* — Robert A. Blaha; Smith Tempel Blaha LLC

(57) ABSTRACT

A component carrier includes a core having a recess, at least one electronic component arranged in the recess, wherein a vertical thickness of the at least one electronic component is larger than a vertical thickness of the core, and an electrically insulating sheet covering at least part of a top main surface of the core, covering at least part of the at least one electronic component and filling a gap between a lateral surface of the at least one electronic component and a lateral surface of the core in the recess.

18 Claims, 9 Drawing Sheets

(52) U.S. Cl.
CPC ......... *H05K 3/4602* (2013.01); *H05K 3/4611* (2013.01); *H01L 2224/04105* (2013.01); *H01L 2224/18* (2013.01); *H01L 2224/2518* (2013.01); *H01L 2224/92144* (2013.01); *H01L 2224/96* (2013.01); *H01L 2924/3511* (2013.01); *H05K 3/4652* (2013.01)

(58) Field of Classification Search
USPC ........ 361/761, 762; 257/178, 633, 747, 787; 174/260, 261; 438/126
See application file for complete search history.

(56) References Cited

U.S. PATENT DOCUMENTS

| | | | |
|---|---|---|---|
| 7,989,944 B2 | 8/2011 | Tuominen | |
| 8,035,127 B2 | 10/2011 | Chia et al. | |
| 8,420,954 B2* | 4/2013 | Lin | H05K 1/0203 |
| | | | 174/15.1 |
| 8,785,788 B2 | 7/2014 | Shimizu et al. | |
| 2005/0034888 A1 | 2/2005 | Hoffmann et al. | |
| 2009/0215231 A1* | 8/2009 | Inoue | H01L 24/19 |
| | | | 438/125 |
| 2012/0188734 A1 | 7/2012 | Mikado et al. | |
| 2014/0360765 A1 | 12/2014 | Kiwanami et al. | |
| 2015/0145145 A1* | 5/2015 | Tsuyutani | H01L 24/05 |
| | | | 257/774 |
| 2015/0271923 A1 | 9/2015 | Shimabe et al. | |
| 2017/0213794 A1* | 7/2017 | Baek | H01L 22/14 |

FOREIGN PATENT DOCUMENTS

| | | |
|---|---|---|
| CN | 104684254 A | 6/2015 |
| CN | 104 918 416 A | 9/2015 |
| JP | 2003197461 A | 7/2003 |

OTHER PUBLICATIONS

Extended European Search Report in EP Application No. 17773411.8; pp. 1-8; dated Feb. 24, 2020; European Patent Office, 80298, Munich, Germany.

* cited by examiner

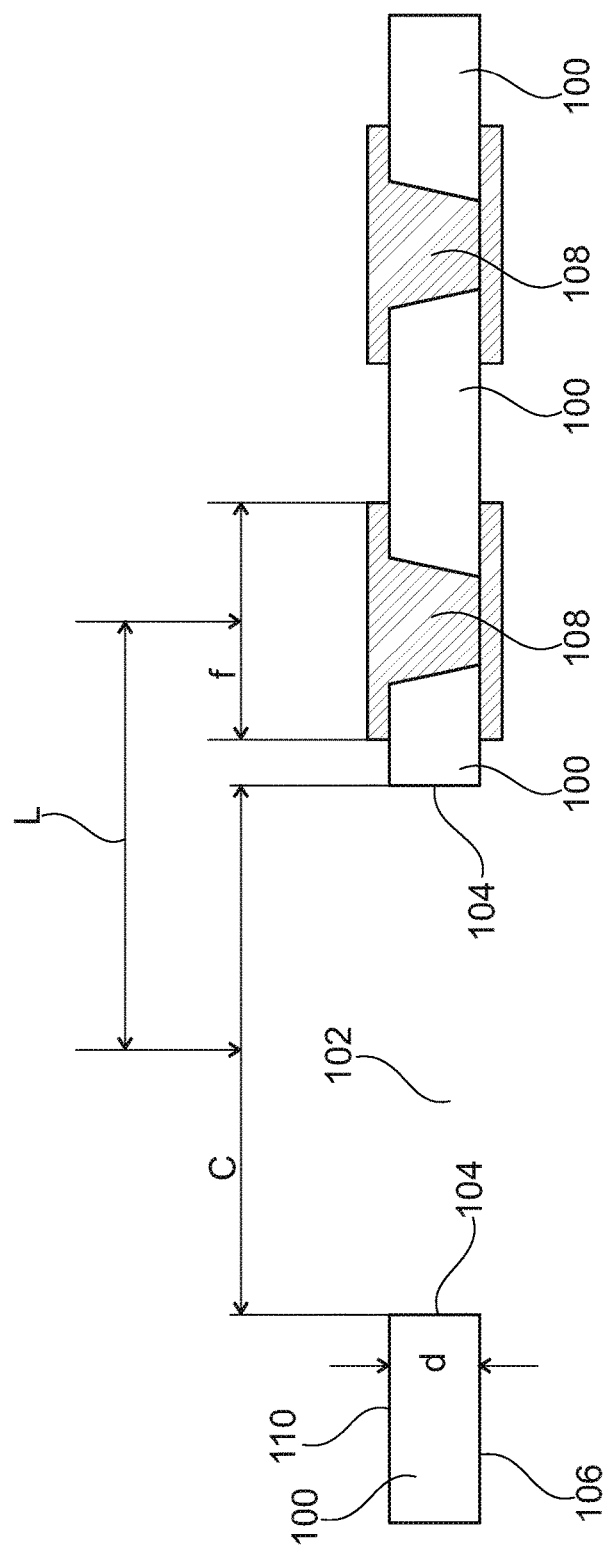
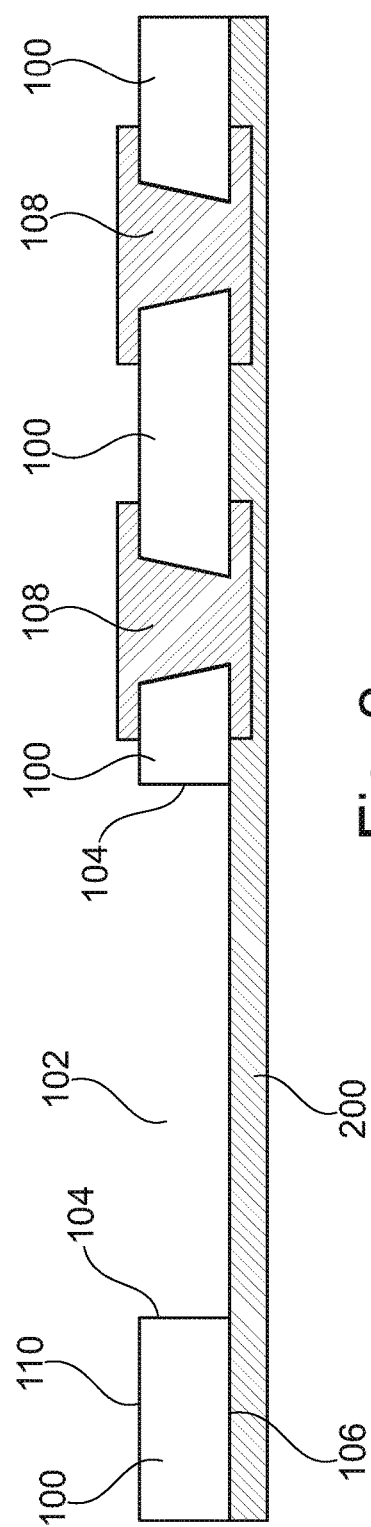

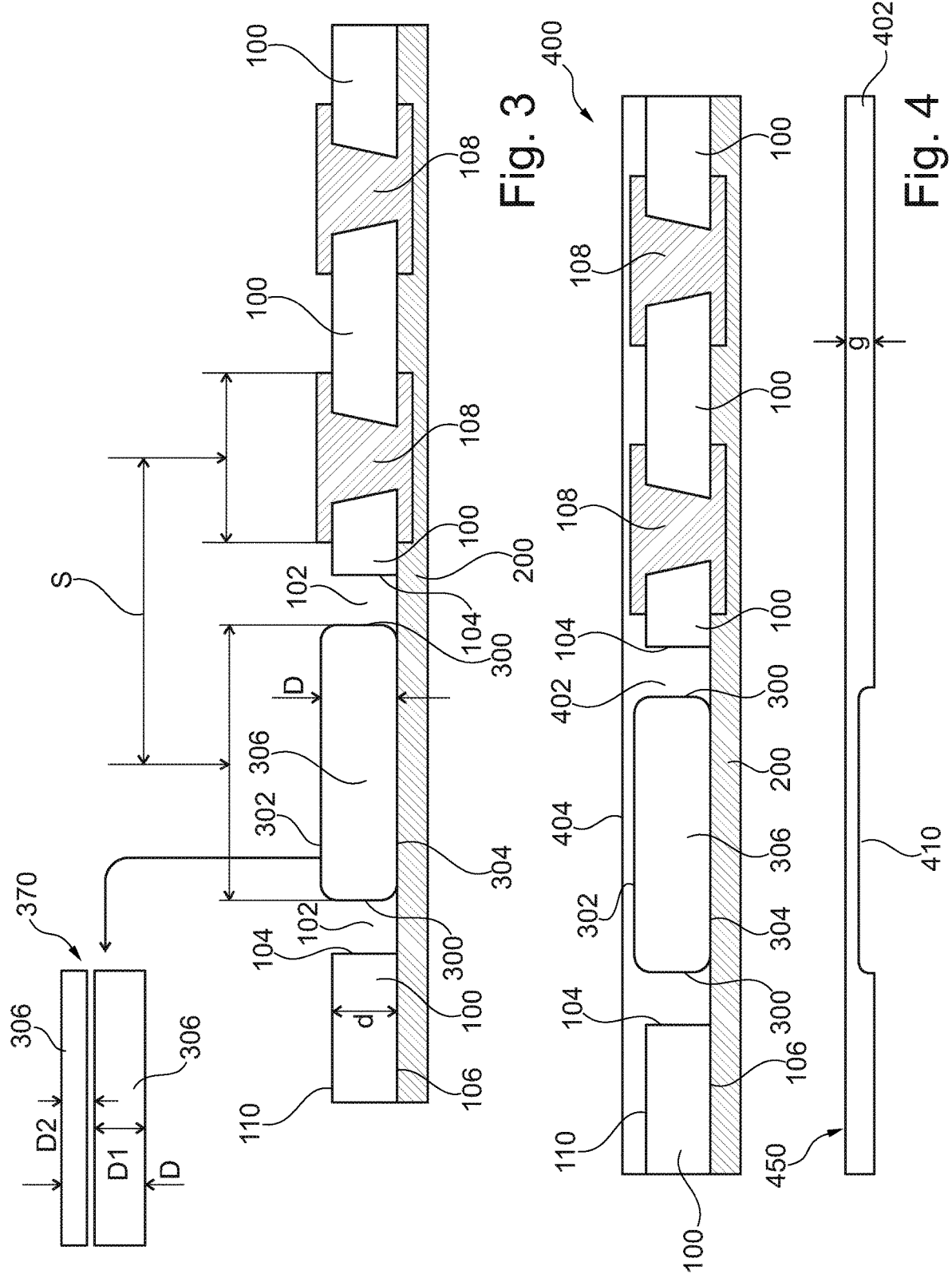

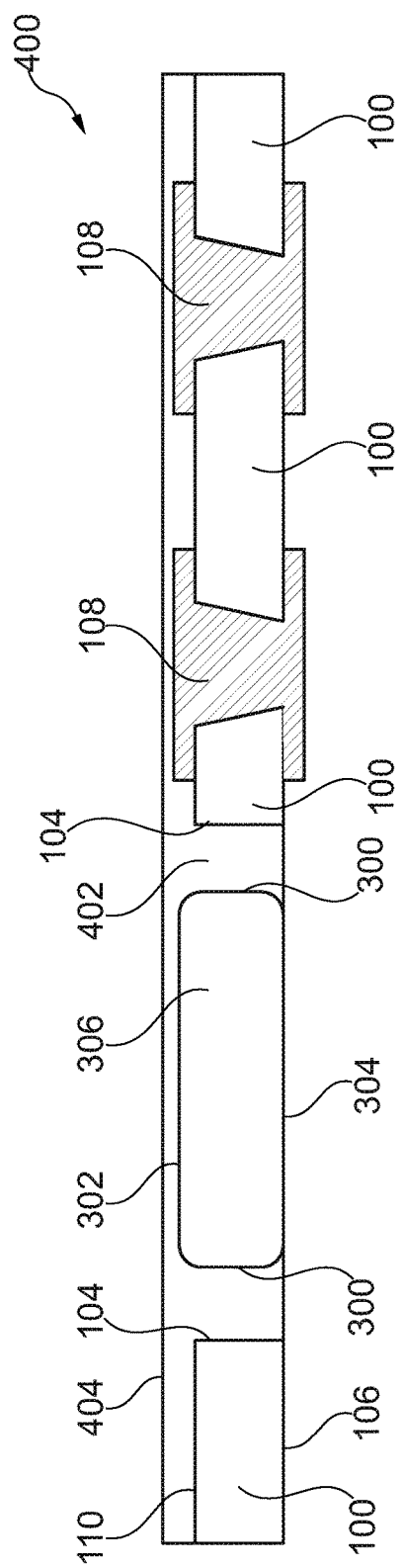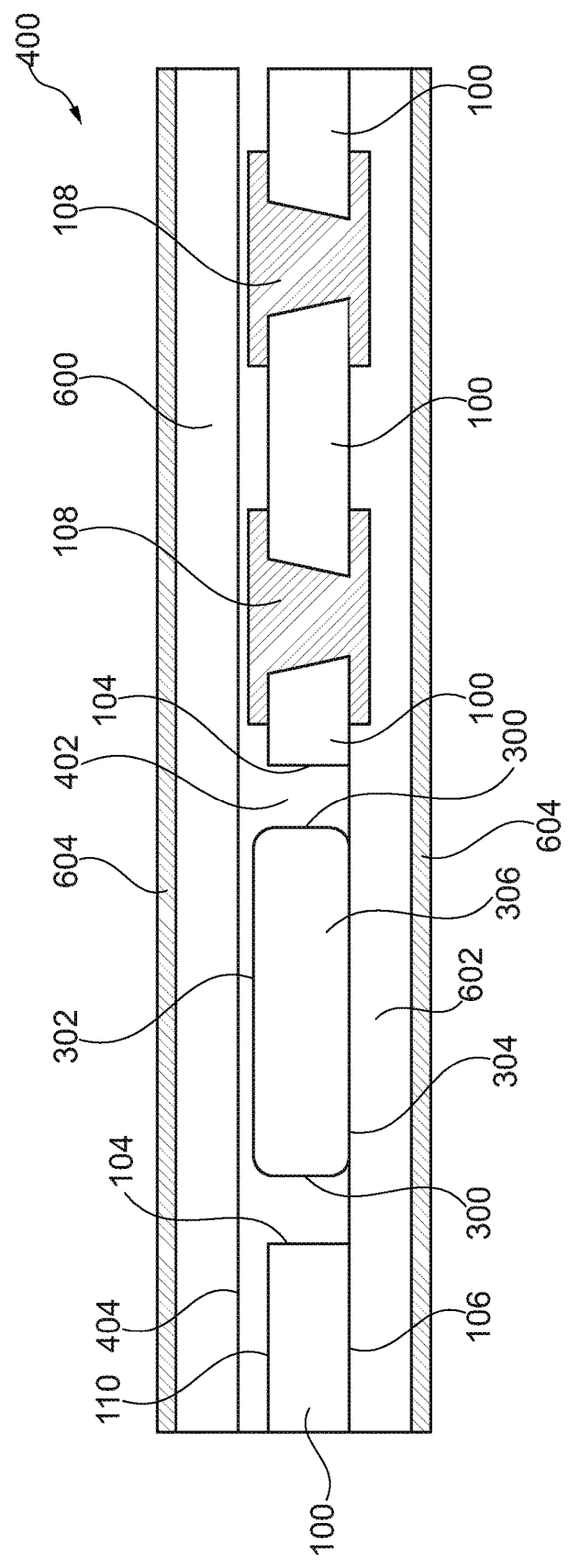

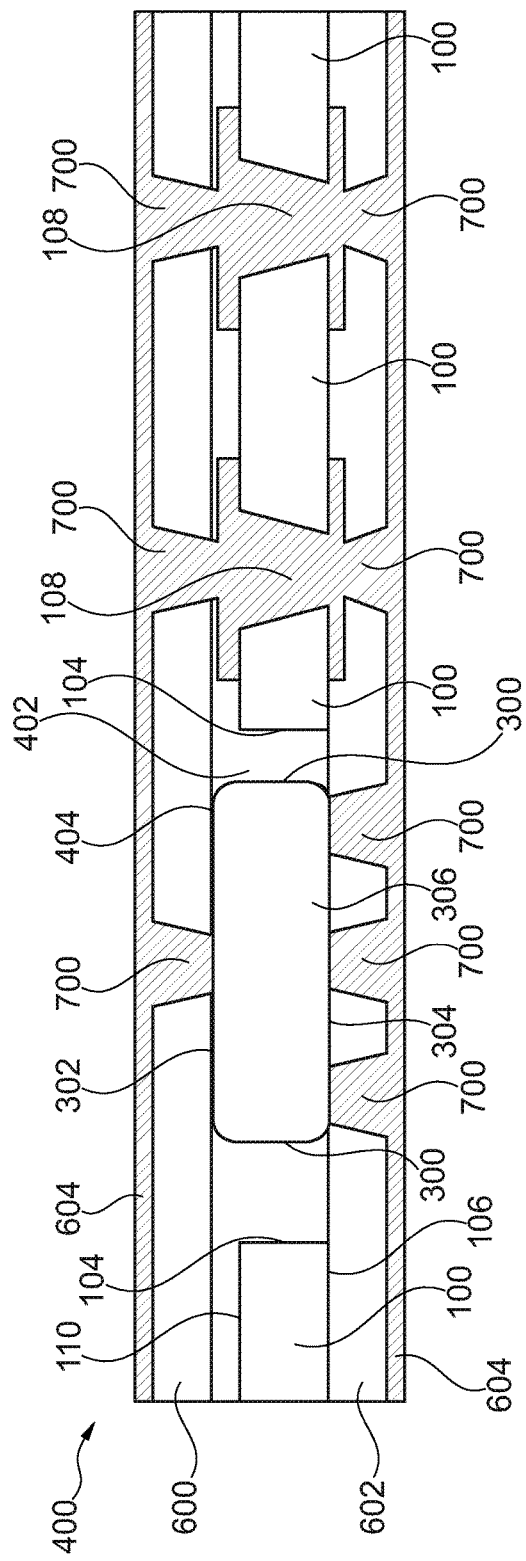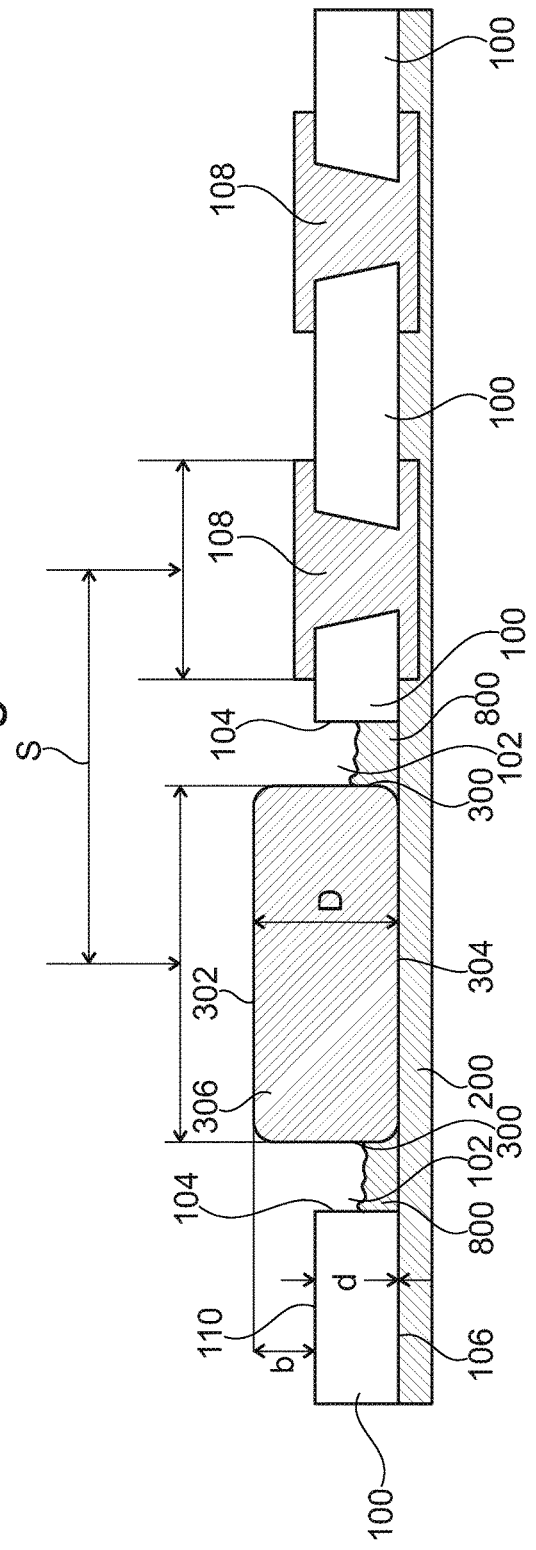

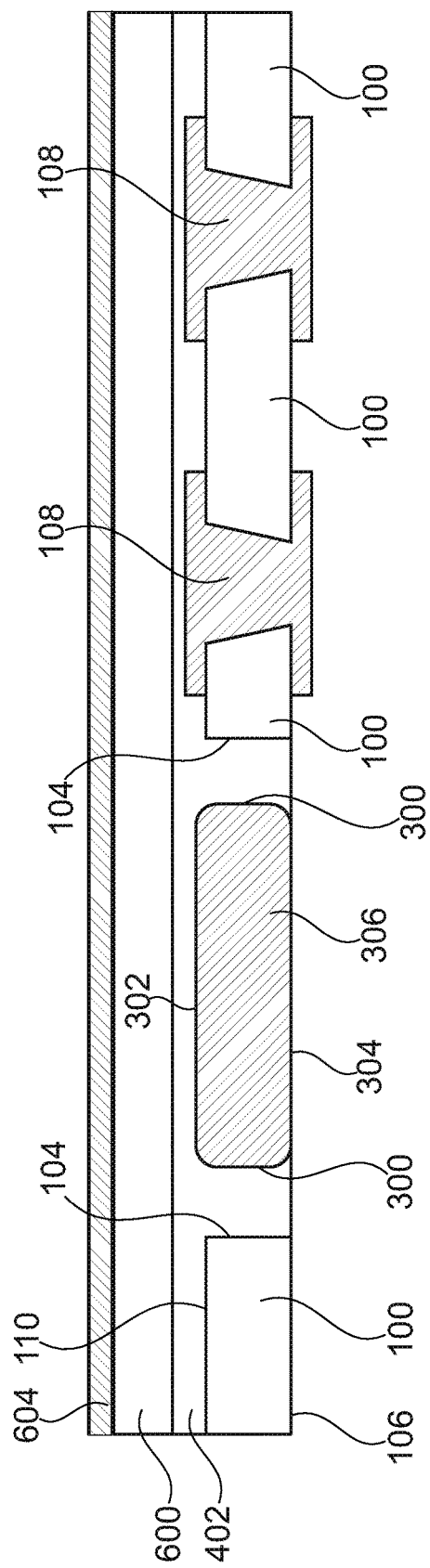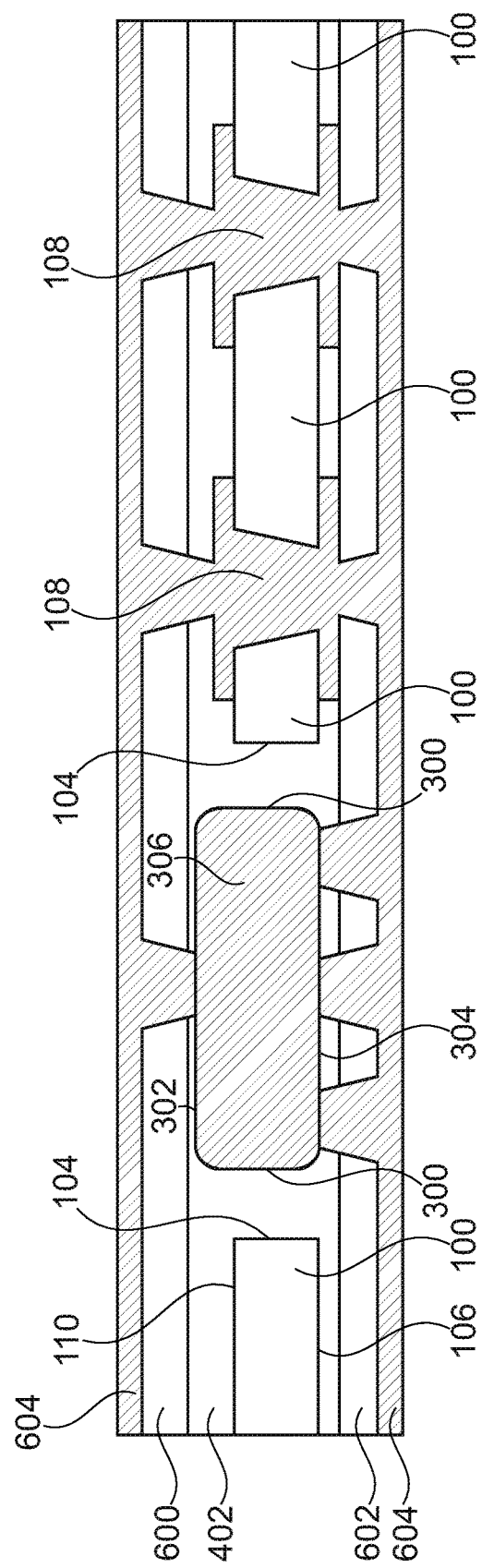

COMPONENT EMBEDDING IN THINNER CORE USING DIELECTRIC SHEET

TECHNICAL FIELD

The invention relates to a component carrier, and a method of manufacturing a component carrier.

TECHNOLOGICAL BACKGROUND

Conventionally, naked dies and other electronic components are packaged in mold compounds made of plastic or resin. However, embedding electronic components is also possible in a laminate such as a printed circuit board (PCB). Currently, embedding is done with technologies using adhesive or other manual methods to attach the electronic component before lamination.

U.S. Pat. No. 7,989,944 B2 discloses a method, in which semiconductor components forming part of an electronic circuit, or at least some of them, are embedded in a base, such as a circuit board, during the manufacture of the base, when part of the base structure is, as it were, manufactured around the semiconductor components. Through-holes for the semiconductor components are made in the base, in such a way that the holes extend between the first and second surface of the base. After the making of the holes, a polymer film is spread over the second surface of the base structure, in such a way that the polymer film also covers the through-holes made for the semiconductor components from the side of the second surface of the base structure. Before the hardening, or after the partial hardening of the polymer film, the semiconductor components are placed in the holes made in the base, from the direction of the first surface of the base. The semiconductor components are pressed against the polymer film in such a way that they adhere to the polymer film.

With continuous demand for small form factors and improved performance at lower costs, there is still room for improved packaging solutions. In particular, conventional PCBs with embedded electronic components may have the tendency of bending. This phenomenon is also denoted as warpage. Furthermore, flexibility in board design is conventionally limited.

SUMMARY

There may be a need to enable simple and reliable packaging of an electronic component with high flexibility in board design.

A component carrier and a method of manufacturing a component carrier according to the independent claims are provided.

According to an exemplary embodiment of the invention, a component carrier is provided which comprises a core having a recess, at least one electronic component arranged in the recess, wherein a vertical thickness of the at least one electronic component is larger than a vertical thickness of the core, and an electrically insulating sheet covering at least part of a top main surface of the core, covering at least part of the at least one electronic component and filling a gap between a lateral surface of the at least one electronic component and a lateral surface of the core in the recess.

According to another exemplary embodiment of the invention, a method of manufacturing a component carrier is provided which comprises providing a core having a recess, arranging at least one an electronic component in the recess, wherein a vertical thickness of the at least one electronic component is larger (in particular at least 10% larger, more particularly at least 20% larger) than a vertical thickness of the core, and connecting an electrically insulating sheet to the core and the at least one electronic component so that material of the sheet covers at least part of the core and of the at least one electronic component and fills a gap between a lateral surface of the at least one electronic component and a lateral surface of the core in the recess.

Overview of Embodiments

In the context of the present application, the term "component carrier" may particularly denote any support structure which is capable of accommodating one or more electronic components thereon and/or therein for providing both mechanical support and electrical connectivity.

In the context of the present application, the term "core" may particularly denote already cured electrically insulating material providing a stable base for embedding one or more electronic components. A core may be made of cured resin (such as epoxy resin) with fibers (such as glass fibers) embedded therein, for example FR4. In particular, such a core may be made of a thickness being higher than that of a single layer (such as a prepreg layer) as used in PCB technology.

In the context of the present application, the term "electronic component" may particularly denote any bulky rather than layer-type active (such as a semiconductor chip) or passive (for instance a copper block) component embedded within an interior of the component carrier.

According to an exemplary embodiment of the invention, a component carrier manufacturing concept is provided in which embedding an electronic component in the component carrier is accomplished by placing the at least one electronic component in a recess of a core, which may be carried out without (or with reduced) previously filling an adhesive into the recess. A higher vertical thickness of the at least one electronic component as compared to a vertical thickness of the core results in a vertical protrusion of the one or more electronic components with regard to an upper main surface of the core. Despite of such a protrusion, embedding of such electronic components is nevertheless made possible according to exemplary embodiments of the invention by covering core and electronic component(s) with a dielectric sheet which has turned out to be capable of balancing or equilibrating height differences of the core-component-arrangement. This provides a circuit designer with the freedom to embed not only electronic components having a smaller or equal height as the core, but also to reliably embed electronic components with a height exceeding a height of the core. Mechanical fixation of the at least one electronic component within the core and embedding the at least one electronic component in dielectric material may hence be accomplished by the lamination of a dielectric sheet on core and the at least one electronic component therein. This is a simple manufacturing concept which ensures correct positioning and high stability of the at least one electronic component within the recess while keeping warpage small. The described manufacturing architecture renders the provision of large amounts of liquid adhesive into the recess prior to the insertion of the at least one electronic component into the recess of the core dispensable and substitutes or supplements this by a lamination of one or more dielectric layer sheets. Moreover, the provided manufacturing technology allows to obtain highly accurate component registration and a very small registration tolerance.

In the following, further exemplary embodiments of the component carrier and the method will be explained.

In an embodiment, the component carrier comprises a further electrically insulating layer structure formed, in particular laminated, on top of the sheet. Any remaining tendency of a manufactured component carrier to bend and show some warpage, in particular on the long-term when the component carrier is made subject to significant temperature changes or temperature cycles, may be further reduced by laminating a further dielectric layer structure onto the sheet (and optionally onto a still uncovered surface portion of the at least one electronic component and/or of the core). The additional provision of the further dielectric layer structure has turned out as a highly efficient measure for reducing warpage and increasing stability and reproducibility.

In an embodiment, the sheet is provided as a continuous layer to cover also an upper surface of the at least one electronic component. More specifically, the sheet may have a blind hole type indentation at the position of and at a main surface facing the at least one electronic component. Such an embodiment is shown in FIG. 4. The difference thickness of the continuous layer at the position of the blind hole as compared to another thickness apart from the position of the at least one electronic component allows a balancing or equilibration of the locally higher thickness of the core-component-arrangement at the position of the protruding electronic component.

In another embodiment, the sheet is provided as a recessed layer having a through hole-type recess to accommodate an upper portion of the at least one electronic component. Such an embodiment is shown for example in FIG. 9. In particular, an excessive locally higher thickness of the core-component-arrangement at the position of the protruding electronic component may be at least partially compensated by a corresponding through hole of the recessed layer. During lamination, adjacent material of the sheet may flow laterally on an upper surface of the at least one electronic component.

In an embodiment, the sheet covers also the upper surface of the at least one electronic component. When a continuous sheet of sufficient size is provided, also the upper surface of the at least one electronic component can be directly covered with material of the sheet. When however an electronic component with a vertical thickness significantly larger than the core is to be embedded, the sheet may be provided with a cutout (such as a through hole) at the position of the at least one electronic component so that the additional electrically insulating layer structure may then cover at least part of the upper main surface of the at least one electronic component.

In an embodiment, the at least one electronic component comprises at least two vertically stacked electronic components (which may have the same or different individual thicknesses) having a total vertical thickness being larger than a vertical thickness of the core. Such an embodiment is shown, for instance, in FIG. 3. Hence, the manufacturing architecture according to an exemplary embodiment of the invention is also compatible with the stacking of two or more electronic components in direct contact with one another. Even when their combined thickness is larger than the thickness of the core, the lamination of the dielectric sheet on the stacked electronic components allows their embedding and adhering in place at the same time. This may be in particular advantageous in terms of stacking multiple memory chips on top of one another. Two or more directly vertically stacked electronic components (in particular semiconductor chips) may be optionally connected to one another by an adhesive film applied to the main surfaces of the electronic components being in contact with one another. It is also possible that the vertically stacked electronic components are connected to one another by an electrically conductive connection element (such as a solder connection), which may for instance electrically couple pads of the electronic component facing one another in the stacked configuration.

As mentioned, a vertical thickness of the at least one electronic component may be larger than a vertical thickness of the core. Thus, the manufacturing architecture according to an exemplary embodiment is compatible with electronic components having a thickness larger than the thickness of the core (compare for instance FIG. 8). Hence, the flexibility of a board designer is significantly increased. Balancing or equilibration of different thicknesses of core and electronic component may be accomplished by the combination of the sheet (which may have a recess or at least an indentation at the position of the at least one electronic component) and a further electrically insulating layer structure which then also fulfills the function of covering an upper main surface of the at least one electronic component, thereby ensuring that the excessively high electronic component is circumferentially fully or substantially fully surrounded by dielectric material.

In an embodiment, the at least one electronic component is entirely surrounded by the same material, in particular by resin material. Such a homogeneous surrounding of the at least one electronic component further reduces the tendency of warpage resulting from thermal stress or load. Since the surrounding dielectric (in particular resin) cladding of the at least one electronic component in the embedded state also results in a circumferentially homogeneous thermal expansion behavior, thermal stress acting on the embedded electronic component can be kept small.

In an embodiment, the component carrier comprises another electrically insulating layer structure laminated on bottom of the core and the at least one electronic component. Thus, a substantially symmetric structure in a vertical direction can be obtained. This further suppresses the tendency of warpage and promotes a flat and planar component carrier.

In an embodiment, the further electrically insulating layer structure and the other electrically insulating layer structure are made of the same material. Pronounced differences in terms of thermal expansion above and below the embedded electronic component can therefore be prevented, thereby further reducing the tendency of bending and warpage.

In an embodiment, the sheet and/or the further electrically insulating layer structure and/or the other electrically insulating layer structure have substantially the same coefficient of thermal expansion (CTE). The CTE may be the same particular in an xy-plane of the plate-shaped component carrier. Additionally or alternatively, the CTE may be the same in a z-direction of the plate-shaped component carrier. Consequently, even significant temperature changes (which may occur for example during operation in summer time and in winter) will not exert excessive thermal load to the component carrier. The latter may therefore maintain its shape even on the long-term.

In an embodiment, the sheet and/or the further electrically insulating layer structure and/or the other electrically insulating layer structure have a coefficient of thermal expansion of less than 20 ppm/° C., in particular less than 15 ppm/° C. Thus, not only the relative differences of the CTE of dielectric material surrounding the at least one electronic component may be small, but also the absolute value of the CTE can be kept low. This may result not only in a symmetric thermal load acting on the various surfaces of the component carrier, but also results in a quantitatively small amount of thermal load as a result of thermal expansion. This has a further positive impact on the mechanical stability and flatness of the component carrier.

In an embodiment, the electrically insulating sheet is an adhesive sheet, in particular comprising or consisting of one of the group consisting of resin (for example epoxy resin), a prepreg layer (in particular a combination of at least partially uncured resin, such as epoxy resin, and fibers, such as glass fibers) and Resin Coated Copper (RCC). A Resin Coated Copper (RCC) foil is a copper foil coated with resin material, for instance epoxy resin, and therefore comprises an electrically conductive copper layer and two electrically insulating resin layers thereon. Before laminating, the sheet may be at least partially uncured (in particular in a B-stage), so that lamination provides for a melting and flow of the sheet material in gaps around the at least one electronic component. After re-solidification, the sheet material adheres the at least one electronic component fixed in place.

In an embodiment, the further electrically insulating layer structure comprises at least part of the at least one of a prepreg layer structure and Resin Coated Copper (RCC). This allows lamination of dielectric material onto the sheet as well as also a following electrically conductive layer structure in one simultaneous procedure.

In an embodiment, the core comprises at least one electrically conductive vertical through connection (such as a via), in particular made of copper. This allows to electrically couple the embedded electronic component to outer portions of the component carrier and consequently to an electronic periphery.

In an embodiment, the core comprises a fully cured dielectric, in particular FR4. Also the CTE value of the core may be adjusted to the CTE values of the sheet and/or of the further electrically conductive layer structure, which may be made of resin-based material (in particular prepreg).

In an embodiment, a build-up on an upper main surface of the sheet is substantially symmetrical to another build-up on a lower main surface of the core, the at least one electronic component and the sheet. Hence, apart from the slight vertical asymmetry of the at least one electronic component vertically extending beyond the core in (in particular exactly) one spatial direction, the remaining layer stack may be symmetrical in a vertical direction. Also this provision contributes to a small warpage and a low tendency of bending.

In an embodiment, the recess is free of additional adhesive material. Therefore, the cumbersome procedure of filling liquid adhesive into the recess prior to the assembly of the at least one electronic component can be omitted. The function of such a conventionally used liquid adhesive can be hence substituted by the sheet, and optionally also by the further electrically insulating layer structure(s).

In an alternative embodiment, the component carrier comprises additional (for instance liquid) adhesive material in the recess, for instance between at least part of the at least one electronic component and the core and/or beneath the at least one electronic component. If desired, a relatively small amount of (for instance liquid) adhesive may be inserted into the recess(es) of the core (so as to cover for example at least part of a bottom and/or at least part of one or more sidewalls of the at least one electronic component). Adhering the top side of the at least one electronic component may then be accomplished by an adhesive function of the laminated sheet and/or of the further electrically insulating layer structure.

In an embodiment, the component carrier further comprises at least one electrically conductive layer structure laminated on and/or within the component carrier. Therefore, the electric coupling between various surface portions of the component carrier and/or of the at least one electronic component with such surface portions and/or an electronic periphery device which may be connected to the component carrier may be supported by the lamination of electrically conductive layer structures (such as copper foils). Such electrically conductive layer structures may be full or continuous layers, or may be patterned layers.

In an embodiment, the method further comprises laminating an adhesive tape to the core before arranging the at least one electronic component in the core and adhering the at least one electronic component to the adhesive tape. Such an adhesive tape may serve as a temporary carrier and may hence provide mechanical stability at a bottom side of the at least one electronic component prior to the lamination and curing of the electrically insulating sheet.

In an embodiment, the method further comprises removing the adhesive tape after laminating the sheet. Thus, the adhesive tape preferably does not form part of the readily manufactured component carrier. In contrast to this, the adhesive tape may only serve temporarily as a mechanical support which can be removed when the curing of the sheet (and optionally also already of the further electrically insulating layer structure) has been completed, so that the latter material can then provide the required mechanical stability for handling the preform of the component carrier instead of the temporary carrier in form of the tape.

In an embodiment, the further electrically insulating layer structure is a further core (for instance made of FR4). Thus, the further electrically insulating layer structure may be already cured when being laminated with the remainder of the layer stack with embedded electronic component. Alternatively, also the further electrically insulating layer structure may be partially uncured (for instance made of prepreg) and can then contribute to the lamination force.

In yet another exemplary embodiment, the other electrically insulating layer structure can be embodied as yet another core (for instance made of FR4). Thus, also the other electrically insulating layer structure may be made of an already cured material when being connected with the remainder of the laminated stack. This results in a highly symmetric structure in particular when also the further electrically insulating layer structure is embodied as a further core, or more generally of already cured material.

In an embodiment, the electrically insulating sheet is laminated with the core and the at least one electronic component. Although other techniques (such as printing, dispensing, injecting, gluing, etc.) for forming or connecting the sheet are possible in embodiments of the invention, it is preferred that the electrically insulating sheet is laminated with core and electronic component(s), i.e. connected by mechanical pressure, optionally accompanied by thermal energy. Lamination not only perfectly fits into PCB manufacturing technology, but also allows for a quick and reliable embedding and adhering of the at least one electronic component in an interior of the component carrier.

In an embodiment, before laminating the electrically insulating sheet, the electrically insulating sheet comprises at least partially uncured material which is cured during laminating the electrically insulating sheet. Curing may be triggered by the application of mechanical pressure (and optionally thermal energy, i.e. heat), which may result in a temporary melting of material (such as resin) of the dielectric sheet and a chemical reaction (such as cross-linking), so that the material of the dielectric sheet contributes to adhesion of the various constituents of the component carrier after re-solidification.

In an embodiment, the component carrier comprises or consists of a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure, if desired supported by thermal energy. The mentioned stack may provide a plate-shaped component carrier capable of providing a large mounting surface for further electronic components and being nevertheless very thin and compact. The term "layer structure" may particularly denote a continuous layer, a patterned layer or a plurality of non-consecutive islands within a common plane.

In an embodiment, the component carrier is shaped as a plate. This contributes to the compact design of the electronic device, wherein the component carrier nevertheless provides a large basis for mounting electronic components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, and a substrate.

In the context of the present application, the term "printed circuit board" (PCB) may particularly denote a plate-shaped component carrier which is formed by laminating several electrically conductive layer structures with several electrically insulating layer structures, for instance by applying pressure, if desired accompanied by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more electronic components which may be embedded in a printed circuit board, a printed circuit board is usually configured for accommodating one or more electronic components on one or both opposing surfaces of the plate-shaped printed circuit board. They may be connected to the respective main surface by soldering.

In the context of the present application, the term "substrate" may particularly denote a small component carrier having substantially the same size as an electronic component to be mounted thereon.

In an embodiment, the at least one electronic component is selected from a group consisting of an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, a sensor, an actuator, a microelectromechanical system, a microprocessor, a capacitor, a resistor, an inductance, a battery, a switch, a camera, an antenna, and a logic chip. However, other electronic components may be embedded in the component carrier. For example, a magnetic element can be used as an electronic component. Such a magnetic element may be a permanent magnetic element (such as a ferromagnetic element, an antiferromagnetic element or a ferrimagnetic element, for instance a ferrite core) or may be a paramagnetic element.

In an embodiment, the at least one electrically insulating layer structure comprises at least one of the group consisting of resin (such as reinforced or non-reinforced resins, for instance epoxy resin), in particular Bismaleimide-Triazine resin, cyanate ester, glass (in particular glass fibers, multilayer glass or glass-like materials), prepreg material, polyimide, polyamide, liquid crystal polymer, epoxy-based Build-Up Film, FR4 material, FR5 material, polytetrafluoroethylene (Teflon®), a ceramic, and a metal oxide. Teflon is a registered trademark of E. I. Du Pont de Nemours and Company of Wilmington, Del., U.S.A. Although prepreg or FR4 are usually preferred, other materials may be used as well.

In an embodiment, the at least one electrically conductive layer structure comprises at least one of the group consisting of copper, aluminum, and nickel. Although copper is usually preferred, other materials are possible as well.

In an embodiment, the component carrier is a laminate-type component carrier. In such an embodiment, the component carrier is a compound of multiple layer structures which are stacked and connected together by applying a pressing force, if desired accompanied by heat.

BRIEF DESCRIPTION OF THE DRAWINGS

The aspects defined above and further aspects of the invention are apparent from the examples of embodiment to be described hereinafter and are explained with reference to these examples of embodiment.

FIG. 1, FIG. 2, FIG. 3, FIG. 4, FIG. 5, FIG. 6 and FIG. 7 illustrate different cross-sectional views of structures obtained when performing a method of manufacturing a component carrier according to an exemplary embodiment of the invention.

FIG. 8, FIG. 9, FIG. 10, FIG. 11 and FIG. 12 illustrate different cross-sectional views of structures obtained when performing a method of manufacturing a component carrier according to another exemplary embodiment of the invention.

FIG. 13, FIG. 14, FIG. 15 and FIG. 16 illustrate different cross-sectional views of structures obtained when performing a method of manufacturing a component carrier according to yet another exemplary embodiment of the invention.

DETAILED DESCRIPTION OF ILLUSTRATED EMBODIMENTS

Figure 9:
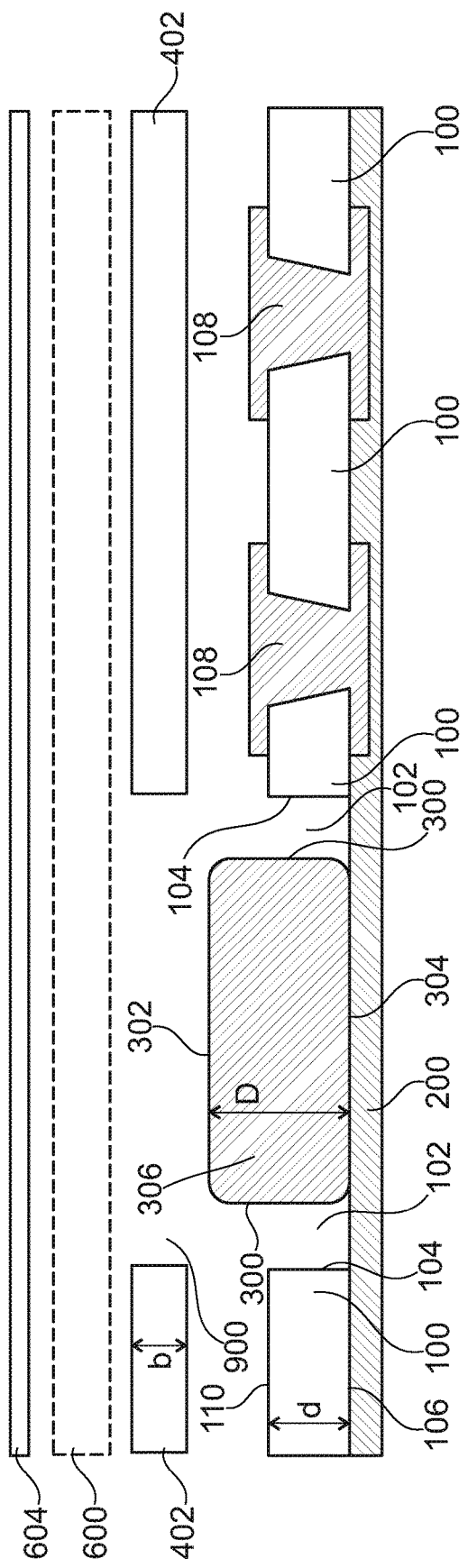

Before, referring to the drawings, exemplary embodiments will be described in further detail, some basic considerations will be summarized based on which exemplary embodiments of the invention have been developed.

According to an exemplary embodiment of the invention, a high registration sequential embedding with subtractive technology is provided which is even compatible with one or more electronic components having a height exceeding a height of a core with a recess in which the one or more electronic components are to be embedded.

One gist of an exemplary embodiment of the invention is to improve embedding technology of active and/or passive components in a PCB by the concept of a double lamination of dielectric layers on top of an electronic component located in a recess of a core. More specifically, exemplary embodiments of the invention provide a board feature and production method with high reliability and high accuracy embedding while simultaneously offering the freedom to embed also electronic components with a height exceeding a height of a core.

More specifically, a PCB board is provided in which one or more components are embedded into a PCB core with two sequential lamination procedure. Using two separate lamination procedures allows the embedding process without additional remaining glue or other attachment components. All material touching the electronic component may be epoxy resin from prepreg and may have the exactly same properties as the core and the adjacent prepreg layers.

Moreover, the PCBs may have two or more electrically conductive layers. Furthermore, the PCB may have one or more electronic components. Advantageously, the described manufacturing architecture does not require any supplementary materials for the electronic component at attachment.

A correspondingly produced PCB may hence involve a high registration accuracy between the embedded component and the substrate where they are embedded within. In particular, overall registration accuracy may be better than ±30 µm. Such a registration system improvement can be defined as follows:

What concerns cavity registration, the manufacturing architecture according to the below described figures may involve a core substrate having one or more cut-out areas. Cut-outs may be produced with mechanical processes like routing, cutting or drilling. According to an exemplary embodiment of the invention, a highly improved registration accuracy of the cavity true position compared to the core substrate pattern can be obtained. In particular, localized targets may be applied in the core pattern and can improve the registration from the larger than ±100 µm tolerance of conventional methods to smaller than ±20 µm registration tolerance. This improvement reduces the space between the component and the core cut-out wall. Advantageously, this improves the produceability and reliability of the readily manufactured component carrier produced with this technology. The cut-out cavities can be produced with laser processes or high accuracy punch methods using local targets.

What concerns component registration, it is possible to use a placement system that can utilize local fiducial targets, and this may allow to reach smaller than ±10 µm registration tolerance.

Also a high component connection laser via accuracy may be obtained. In an embodiment, it is possible to apply for a high accuracy connection technology that may achieve smaller than ±15 µm registration tolerance for the laser drilling. This can be reached by local targets and skiving technology (opening the inner layer registration target pads with laser processing).

In terms of insulation material of the component carrier, to reach a targeted overall registration tolerance it is possible to apply low CTE type of materials. More specifically the CTE I (x, y as defined by IPC standard) can be preferably below 15 ppm/° C.

What concerns copper foil material, improved registration can be further promoted by a stable and even shaped laser drilling. Thus, it may be advantageous to specifically apply a VLP copper foil type (more specifically the bottom side of the copper foil that is facing the dielectric layer, that is facing the component) can preferably have a roughness $R_z$<3.5 µm.

According to a further highly advantageous exemplary embodiment of the invention, it is possible to provide a product and process with a connection terminal metal thickness of the components smaller than 6 µm. In such an embodiment, a preform of the component carrier may be processed by opening the copper foil firstly with etching process or UV laser process. An advantageous embodiment (related to the registration capability) is that either the imaging procedure of the etching process or the UV laser process registration can be done by local targets to improve the overall registration accuracy of the connections. For UV laser, special parameters may ensure that UV will only cut through the outermost copper layer and $CO_2$ laser treatment may be implemented to clean the resin with soft low energy parameters to ensure there is no damage on the component terminal.

As a result, exemplary embodiments of the invention may improve the reliability and processability of embedding and may suppress warpage and undesired bending of the formed component carrier. In particular, the described manufacturing architecture can be advantageously used for any high end highly integrated packages.

FIG. 1 to FIG. 7 illustrate different cross-sectional views of structures obtained when performing a method of manufacturing a component carrier 400 (see FIG. 4 to FIG. 7) according to an exemplary embodiment of the invention.

In order to obtain the structure shown in FIG. 1, a PCB core 100 (here embodied as a plate of already fully cured FR4 material) is provided with a recess 102 (which can be formed by cutting or laser processing, and which can be a through hole, as shown in FIG. 1, or alternatively a blind hole) of a width c (which may be, for instance, several mm). Although only a single recess 102 is shown in FIG. 1, the described manufacturing procedure can be carried out as a batch procedure in which a plurality of component carriers 400 is formed on panel size which are then separated. For the sake of simplicity, the following description focuses on the manufacture of the component carrier 400 shown in FIG. 4 to FIG. 7 only. Apart from the above-mentioned fully cured dielectric material (in particular fully cured epoxy resin, preferably with glass fibers therein), the core 100 may be provided with or penetrated by one or more electrically conductive vertical through connections 108, which are here embodied as copper vias with lands, on opposing main surfaces of the core 100. The lands or pads may be formed by patterning a copper foil. Furthermore, although not shown in FIG. 1, the core 100 may already be provided (prior to the embedding of the electronic component 306, compare FIG. 3) with electrically conductive traces (for instance formed as a patterned copper layer) on one or both of opposing main surfaces 106, 110 of the core 100. Such electrically conductive traces may be electrically connected to the vertical through connections 108. In the shown embodiment, the recess 102 is free of liquid adhesive material. Preferably and as a consequence of the described manufacturing procedure, a tolerance of distance L between a center of the recess 100 and a center of a reference through connection 108 of a width f (which may be, for instance, several hundred µm) may be less than ±20 µm. Hence, a core 100 may be formed with cutout recesses 102 in component areas, i.e. at the positions where later electronic components 306 are to be accommodated. For example, a homogeneous vertical thickness d of the core 100 may be in a range between 80 µm and 350 µm. The recesses 102 may be laterally delimited by a sidewall as lateral surface 104. The core 100 of the homogenous thickness d is vertically delimited between an upper main surface 110 and a lower main surface 106.

In order to obtain the structure shown in FIG. 2, an adhesive tape 200 is laminated to the lower main surface 106 of the core 100 before (see FIG. 3) arranging electronic components 306 in the recesses 102 of the core 100. The adhesive tape 200 closes the recesses 102 at a bottom thereof and serves as a temporary carrier which provides temporary stability to the electronic components 306. As shown in FIG. 5, the adhesive tape 200 is to be removed later. For example, the adhesive tape 200 may be a layer stack of polyimide and polypropylene with a thin adhesive film on top (for instance having a thickness of around 1 µm). Preferably, the adhesive tape 200 has an overall thickness in a range between 25 µm and 150 µm.

In order to obtain the structure shown in FIG. 3, an electronic component 306 (being vertically delimited between bottom main surface 304 and upper main surface 302, and being horizontally delimited by a circumferential lateral surface 300) is inserted into the recess 102 and is adhered to the adhesive tape 200. A vertical thickness D of the electronic component 306 is larger than a vertical thickness d of the core 100. Since lower main surface 304 of the electronic component 306 is aligned with and is positioned at the same vertical level as lower main surface 106 of the core 100 as a result of the provision of the planar adhesive foil 200, upper main surface 302 of the electronic component 306 vertically extends beyond and protrudes over upper main surface 110 of the core 100 (as a result of D>d). In other words, bottom main surface 304 of the electronic component 306 is flush or flushes with, is aligned with, and is at the same vertical level as bottom main surface 106 of the core 100.

A detail 370 of FIG. 3 shows that the electronic component 306 with the excessive thickness D>d can also be substituted by two or more vertically stacked electronic components 306 which may have individual thicknesses D1 and D2, wherein D=D1+D2>d and D1>D2 (however might also be D1=D2). Hence, any electronic component 306 shown in FIG. 1 to FIG. 16 may be substituted by two or more stacked electronic components 306, as shown in detail 370.

For instance, the electronic component 306 may be a semiconductor chip. Preferably and as a consequence of the described manufacturing procedure, a tolerance of distance S between a horizontal center of the electronic component(s) 306 and a horizontal center of the reference through connection 108 may be less than ±10 µm.

In order to obtain component carrier 400 shown in FIG. 4, a continuous electrically insulating sheet 402 (see detail 450, wherein a vertical thickness g of the planar continuous electrically insulating sheet 402 before lamination may be in a range between 50 µm and 100 µm) of uncured prepreg (also denoted as B-stage resin with fibers therein) is laminated with the core 100 and the electronic component 306 so that material of the sheet 402 covers the upper main surface 110 of the core 100, the upper main surface 302 of the electronic component 306 and fills a gap between the lateral surface 300 of the electronic component 306 and the lateral surface 104 of the core 100 in the recess 102. In order to compensate the different thickness D of the electronic component 306 as compared to the thickness d<D of the core 100, the sheet 402 has a blind hole type indentation 410 at the position of and at a main surface facing the electronic component 306. With this geometry adaptation, the solid adhesive sheet 402 can be laminated with the stepped arrangement of core 100 and electronic component 306 according to FIG. 3 for cavity filling. Before laminating the electrically insulating sheet 402 to the remainder of the layer stack according to FIG. 4, the electrically insulating sheet 402 comprises uncured material which is cured during laminating the electrically insulating sheet 402 to the core 100 and to the electronic component 306. Since the electronic component 306 has been adhered on the adhesive tape 200, no material of the electrically insulating sheet 402 covers the lower or bottom main surface 304 electronic component 306.

Conventional manufacturing architectures involve a huge concern on the capability to fill a cavity or recess 102. In order to overcome such a shortcoming, the described exemplary embodiment of the invention separately laminates the adhesive resin sheet 402 on the top side of the panel to fill the recesses 102. This additional resin material (whereas also other materials can be considered for sheet 402) can be laminated in a separate process and may thus create a solution to enable the embedding process to be used for much wider range of applications and with better accuracy. Of special concern and limitation of conventional manufacturing techniques have been designs with different size (in the xy-plane, i.e. the horizontal plane according to the figures) and height (z-direction, i.e. the vertical direction according to the figures) of electronic components 306 on the same core 100. The described exemplary embodiment overcomes such shortcomings while offering a reliable solution with reinforced material on both sides of the panel. The final embedded package or component carrier 400 may be slightly asymmetrical in vertical direction.

In order to obtain the component carrier 400 shown in FIG. 5, the adhesive tape 200 is removed after having completed the lamination of the sheet 402. Since the cured laminated material now contributes to the stability of the structure according to FIG. 5, the adhesive tape 200 is no longer needed for handling purposes.

In order to obtain the component carrier 400 shown in FIG. 6, a further electrically insulating layer structure 600 (for example a prepreg layer or a Resin Coated Copper (RCC) structure), which may comprises an at least partially uncured material, is laminated on top of the sheet 402. Simultaneously, another electrically insulating layer structure 602 may be laminated on the bottom or lower main surface 106 of the core 100 and on the bottom or lower main surface 304 of the electronic component 306. The other electrically insulating layer structure 602 may also contact part of the laminated sheet 402 between core 100 and electronic component 306.

Furthermore, electrically conductive layer structures 604 (here embodied as copper foils) are laminated onto opposing main surfaces of the component carrier 400, more precisely on exposed surfaces of the further electrically insulating layer structure 600 and the other electrically insulating layer structure 602. A thickness of the electrically conductive layer structures 604 may be for example in a range between 1 µm and 36 µm. As a result, a build-up on top of an upper main surface 404 of the sheet 402 is substantially symmetrical to another build-up on lower main surface 106 of the core 100, lower main surface 304 of the electronic component 306 and a lower surface of the sheet 402. The described additional lamination procedure results in a small warpage, high stability, high registration accuracy and reproducible and symmetrical build up.

Preferably, the further electrically insulating layer structure 600 and the other electrically insulating layer structure 602 are made of the same material and have the same thickness. Advantageously, the sheet 402, the further electrically insulating layer structure 600 and the other electrically insulating layer structure 602 may be provided from material with the same coefficient of thermal expansion. Further preferably, the sheet 402, the further electrically insulating layer structure 600 and the other electrically insulating layer structure 602 may have a relatively low coefficient of thermal expansion of less than 15 ppm/° C. The mentioned material selection further suppresses thermally induced warpage. A further advantage of the provision of the further electrically insulating layer structure 600, when the latter is provided in an uncured state prior to its lamination to the already laminated sheet 402, is that the electronic component 306 may be already fixed in place and position by the sheet 402 when subsequent prepreg lamination of the further electrically insulating layer structure 600 takes place.

In order to obtain the component carrier 400 shown in FIG. 7, electric connections to the electronic component 306 and/or to the core 100 may be made. Such an electric connection may be a one-sided connection or a two-sided connection, depending on an application (in particular depending on whether the electronic component 306 has one or more pads on only one main surface 302, 304, or on both opposing main surfaces 302, 304 thereof). The formation of such an electric connection may be accomplished by drilling (for instance by a mechanical treatment or by laser processing) via holes and by filling them subsequently by electrically conductive material such as copper, thereby forming further vertical through connections 700.

As a consequence of the described manufacturing procedure, the plate-shaped PCB-type component carrier 400 according to a preferred exemplary embodiment of the invention is obtained, which is shown in FIG. 7. This component carrier 400 comprises the core 100 with the recess 102 filled with material of the electrically insulating sheet 402 only. The electronic component 306 is arranged in the recess 102 and is surrounded by dielectric material of the sheet 402 and of the other electrically insulating layer structure 602. Apart from the dielectric material, only the copper material of the vertical through connections 700 is in contact with the electronic component 306. The laminated electrically insulating sheet 402 covers part of the core 100 and part of the electronic component 306 and particularly fills the gap between lateral surface 300 of the electronic component 306 and lateral surface 104 of the core 100 in the recess 102. The further electrically insulating layer structure 600 is laminated on top of the sheet 402 and is made of a very similar material in terms of thermal expansion properties, thereby reducing warpage. The vertical thickness D of the electronic component 306 is larger than the vertical thickness d of the core 100.

FIG. 8 to FIG. 12 illustrate different cross-sectional views of structures obtained when performing a method of manufacturing a component carrier 400 according to another exemplary embodiment of the invention. As in the embodiment according to FIG. 1 to FIG. 7, also in the embodiment according to FIG. 8 to FIG. 12, the vertical thickness D of the electronic component 306 is larger than the vertical thickness d of the core 100, wherein D-d=b. As will be described in the following in further detail, the manufacturing architecture according to exemplary embodiments of the invention is compatible with the large component height according to FIG. 8. Generally, a vertical thickness D of the electronic component 306 may be in a range between 50 μm and 400 μm.

In order to obtain the structure shown in FIG. 8, the electronic component 306 with the large component height D>d is placed in the recess 102 within the core 100 so that lower main surface 304 of the electronic component 306 is flush with or is horizontally aligned with lower main surface 106 of the core 100. Moreover, upper main surface 302 of the electronic component 306 extends vertically beyond upper main surface 110 of the core 100. However, as in all embodiments of the invention, it is optionally possible to insert a certain amount of liquid adhesive 800 (schematically shown in FIG. 8) before or after placing the electronic component 306 in the recess 102 (in FIG. 9 to FIG. 12, such liquid adhesive 800 is however omitted, since its provision is only an option). In preferred embodiments, no additional adhesive 800 is however inserted into the recess 102 apart from solid adhesive material of sheet 402.

In order to obtain the structure shown in FIG. 9, an uncured electrically insulating sheet 402 (preferably made of B-stage prepreg, or RCC) is placed on top of the structure shown in FIG. 8. However, sheet 402 is pre-structured according to FIG. 9. More specifically, the sheet 402 is provided as a recessed layer having a recess 900 in form of a through hole to accommodate a protruding upper portion of the electronic component 306. Preferably, a thickness of the sheet 402 is at least approximately b=D-d so that the thickness b of sheet 402 together with the thickness d of core 100 at least substantially corresponds to the thickness D of the electronic component 306.

On top of sheet 402, further electrically insulating layer structure 600 is placed. In the shown embodiment, the further electrically insulating layer 600 may be a continuous layer. However, alternatively, further electrically insulating layer structure 600 may also have a recess (not shown), depending on the particularities of a specific application (in particular depending on a relation between the thickness D of the electronic component 306 in comparison to the thickness d of the core 100 and the thickness b of the sheet 402).

Designs with a component height D higher than the core thickness cannot be realized easily with conventional manufacturing architectures. In contrast to this, this is possible with exemplary embodiments of the invention in which at least one of the dielectric layers (here sheet 402) on top of the construction is to be pre-structured. If another material layer (here further electrically insulating layer structure 600) is added, this layer can be either pre-structured or full/continuous depending on the requirements of a certain application.

As a result, exemplary embodiments of the invention allow more flexibility on the embedded core construction and allow for a clear benefit in terms of freedom of design by enabling thinner core constructions compared to conventional procedures. The additional material layer (here further electrically insulating layer structure 600) can be added as required. The latter layer can be either pre-cut or full depending on the design requirements.

Figure 10:
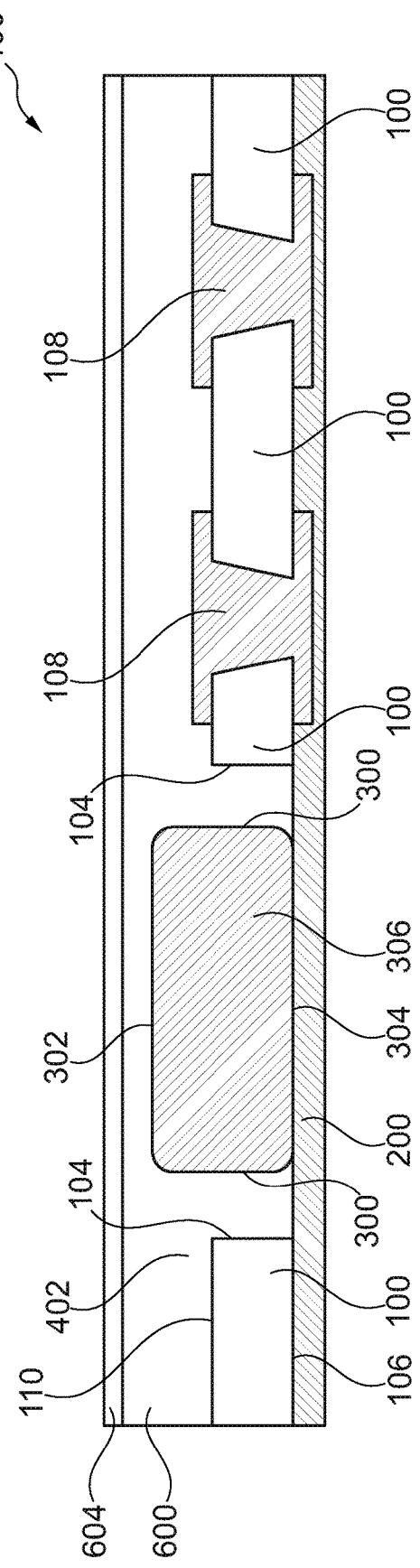

In order to obtain component carrier 400 shown in FIG. 10, a first lamination procedure is finalized during which material of electrically insulating sheet 402 and/or of electrically insulating layer structure 600 flows into the gaps between electronic component 306 on the one hand and core 100 on the other hand. It is also possible that, upon laminating and curing, material of the electrically insulating sheet 402 together with material of the electrically insulating layer structure 600 flow into one another and form an integral structure, thereby further suppressing undesired bending of the component carrier 400 to be manufactured.

Figure 11:
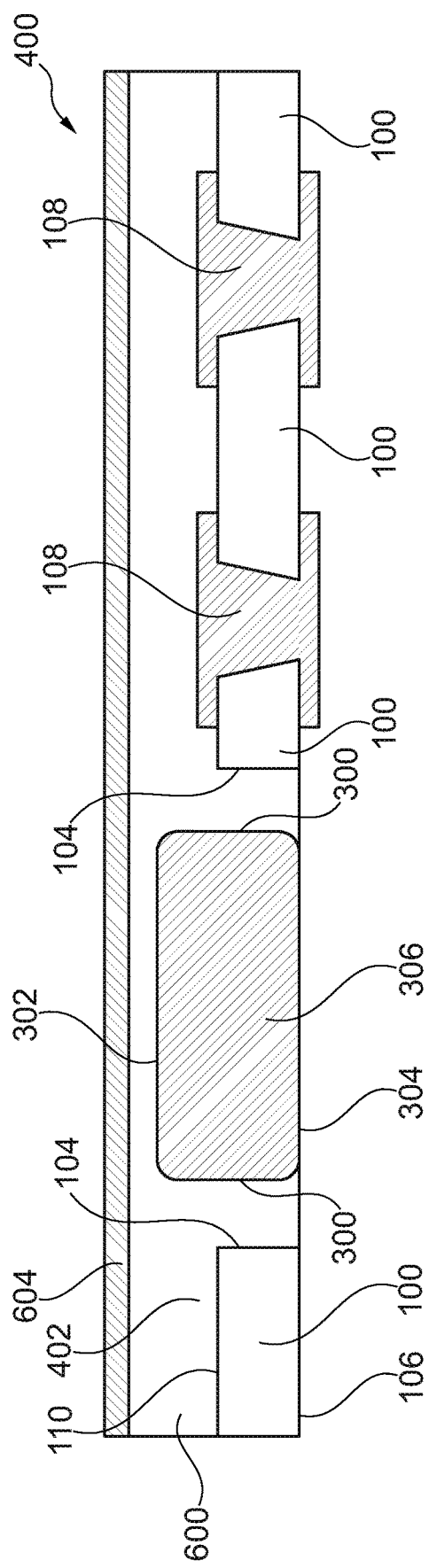

In order to obtain the component carrier 400 shown in FIG. 11, the temporary carrier, which is here embodied as adhesive sheet 200, is removed. In other embodiments, it is also possible that a permanent carrier is used which remains part of the final component carrier 400.

Figure 12:
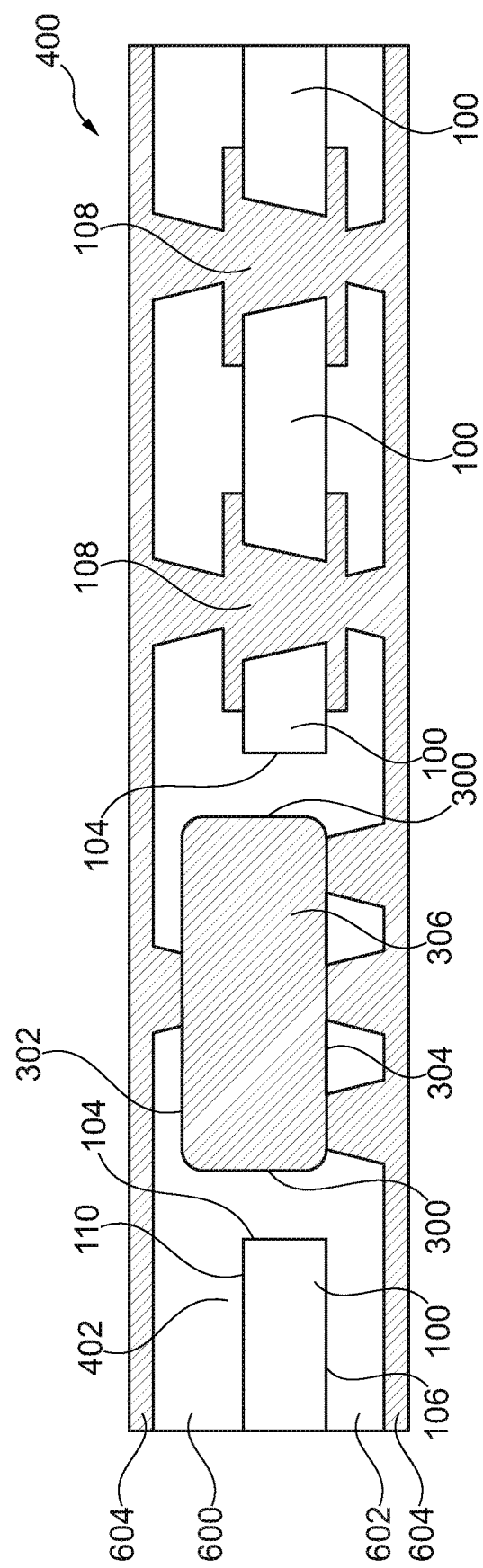

In order to obtain the component carrier 400 shown in FIG. 12, a second lamination may be finalized and electric connections may be made to the electronic component 306 as well as to the core 100 (one-sided or two sided). The substantially symmetric build up formed therewith can be taken from FIG. 6 and FIG. 7 and corresponding description.

FIG. 13 to FIG. 16 illustrate different cross-sectional views of structures obtained when performing a method of manufacturing a component carrier 400 according to yet another exemplary embodiment of the invention. A significant difference between the embodiment of FIG. 13 to FIG. 16 compared to the embodiment according to FIG. 8 to FIG. 12 is that a further core of fully cured material (such as FR4) is used as further electrically insulating layer structure 600 according to FIG. 13 rather than uncured material (such as prepreg). Optionally, it is further possible that yet another core of fully cured material (such as FR4) is used as electrically insulating layer structure 602 according to FIG. 16 rather than uncured material (such as prepreg), which results in a highly symmetric arrangement. For example, a vertical thickness H of the further core (see reference numeral 600 according to FIG. 13 to FIG. 16) may be in a range between 80 μm and 350 μm. A proper heat dissipation may be obtained with the embodiment according to FIG. 14 to FIG. 16. Furthermore, core 100 has again a smaller thickness d<D than electronic component 306 according to FIG. 13 to FIG. 16.

Figure 13:
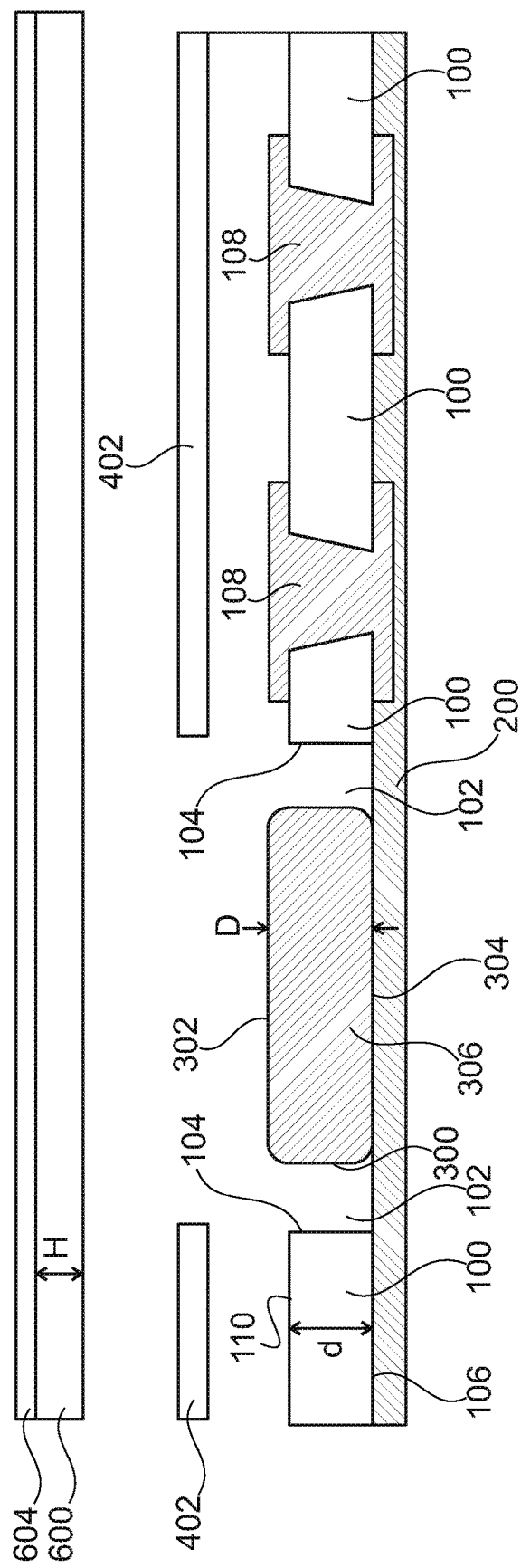

In order to obtain the structure shown in FIG. 13, a layer sequence as shown in FIG. 9 is provided with the differences that the further electrically insulating layer structure 600 is a further core according to FIG. 13. Thus, a fully cured core material may be used as further electrically insulating layer structure 600 on top of the B-stage layer-type sheet 402 to create a fully even surface.

Conventional manufacturing architectures for embedding have continuous issues with the co-planarity of the surface when embedding electronic component 306 in the cavities or recesses 102. The co-planarity issues and dents on the surface are caused by the process as the free resin will flow into the cavities and the surface will not be completely even. To prevent this phenomena, the exemplary embodiment of the invention according to FIG. 13 to FIG. 16 solves this issue by dividing the dielectric layer into B-stage material (see reference numeral 402) and C-stage material (see reference numeral 600). Consequently, it is possible to laminate a fully cured thin core on top. In addition, a prepreg layer (or a similar material) may be used in between to finalize the lamination. The prepreg layer can be pre-cut or not depending on the requirements of a certain application.

Figure 14:
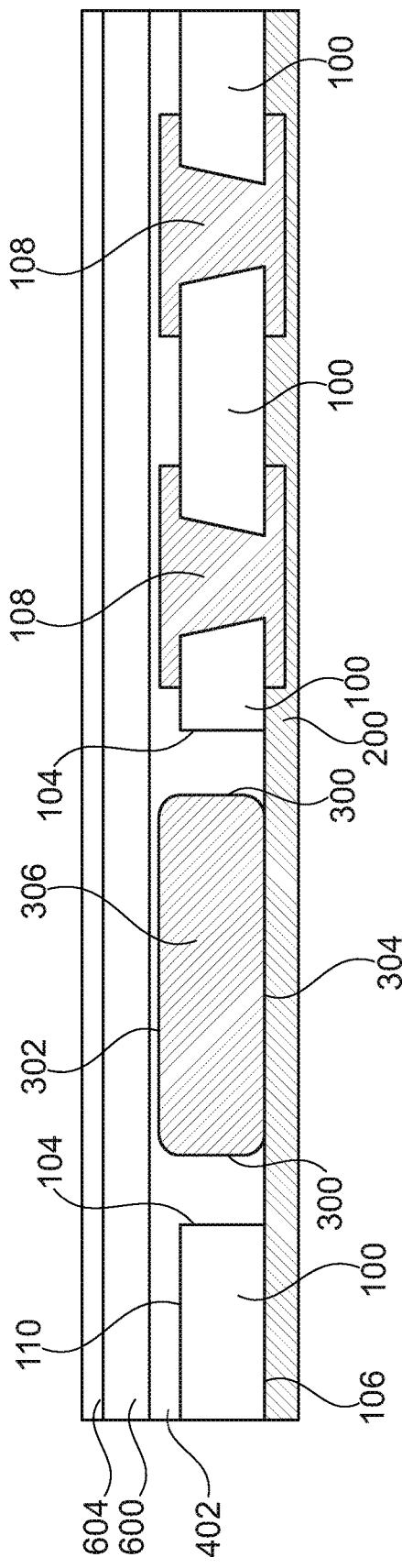

In order to obtain component carrier 400 shown in FIG. 14, a first lamination of the elements shown in FIG. 13 is completed.

In order to obtain the component carrier 400 shown in FIG. 15, the adhesive tape 200 is removed.

In order to obtain the component carrier 400 shown in FIG. 16, a second lamination is finalized and connections are made to the electronic component 306 as well as to the core 100 (one-sided or two sided). The substantially symmetric build up formed therewith can be taken from FIG. 6 and FIG. 7 and corresponding description. The second lamination can be done with only prepreg layer (resulting in an asymmetrical design) or with core and prepreg design (resulting in a symmetrical design).

Figure 17:
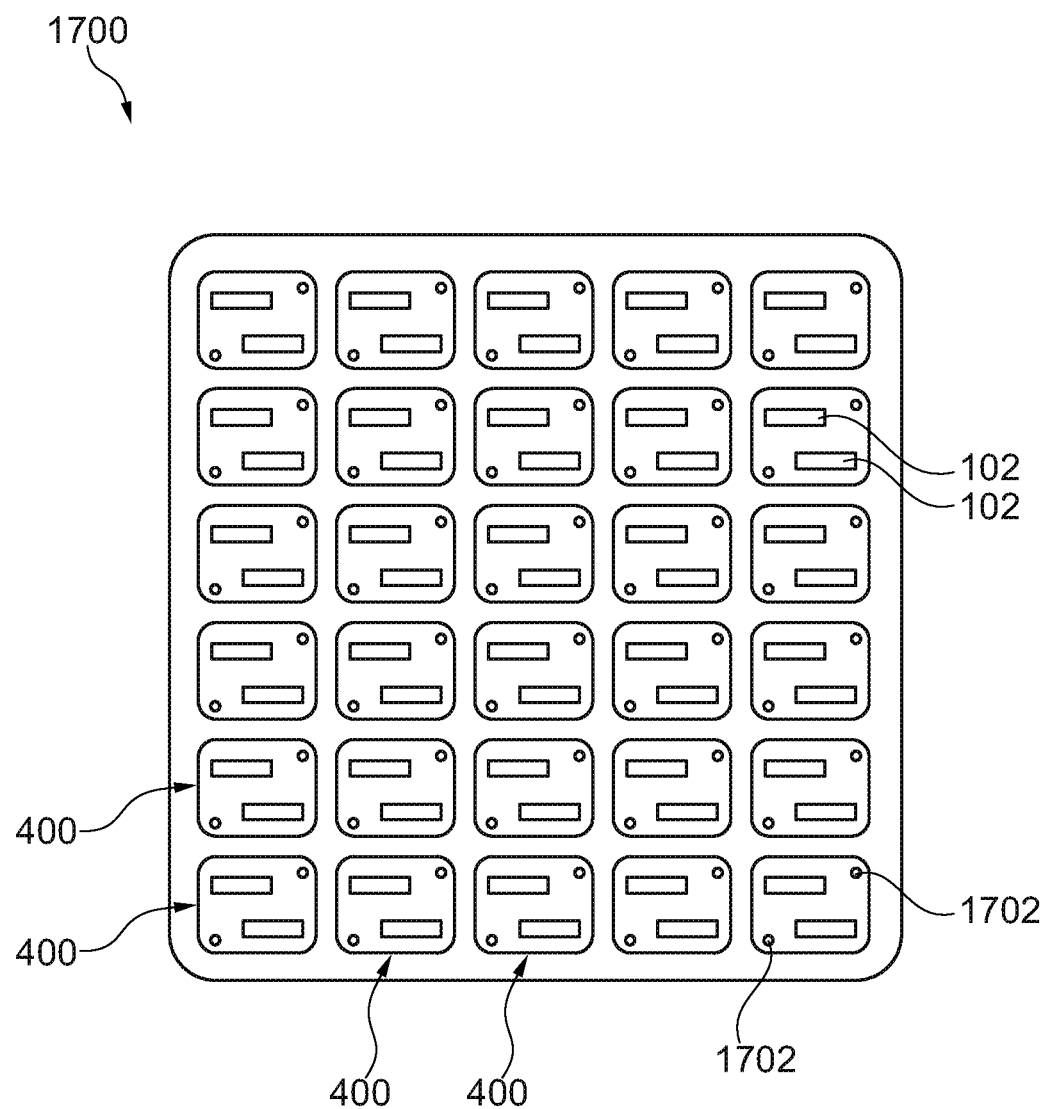
FIG. 17 shows a plan view of a pre-form of multiple still integrally connected component carriers manufactured simultaneously in a batch manufacturing procedure according to an exemplary embodiment of the invention.

FIG. 17 shows a plan view of a pre-form or panel 1700 of multiple still integrally connected component carriers 400 arranged in a matrix-like pattern and manufactured simultaneously in a batch manufacturing procedure according to an exemplary embodiment of the invention. Each of the cards or component carriers 400 also has alignment markers 1702. In order to singularize the individual component carriers 400 from the integral panel 1700, a cutting procedure may be carried out.

It should be noted that the term "comprising" does not exclude other elements or steps and the "a" or "an" does not exclude a plurality. Also elements described in association with different embodiments may be combined.

Implementation of the invention is not limited to the preferred embodiments shown in the figures and described above. Instead, a multiplicity of variants are possible which use the solutions shown and the principle according to the invention even in the case of fundamentally different embodiments.

The invention claimed is:

1. A component carrier, comprising:
a core having a recess;
at least one electronic component arranged in the recess, wherein a vertical thickness of the at least one electronic component is larger than a vertical thickness of the core;
an electrically insulating sheet covering at least part of a top main surface of the core, covering at least part of the at least one electronic component and filling a gap between a lateral surface of the at least one electronic component and a lateral surface of the core in the recess; and
another electrically insulating layer structure laminated on a bottom of the core and on a bottom of the at least one electronic component, wherein the another electrically insulating layer structure comprises a fully cured core material;
wherein a bottom main surface of the at least one electronic component is flush with a bottom main surface of the core;
wherein the electronic component comprises one or more pads at the bottom main surface; and
wherein at least one via is formed through the another electrically insulating layer structure to electrically contact the pad of the electronic component.

2. The component carrier according to claim 1, wherein the electrically insulating sheet is laminated with the core and the at least one electronic component.

3. The component carrier according to claim 1, wherein the sheet covers an upper surface of the at least one electronic component.

4. The component carrier according to claim 1, wherein the at least one electronic component comprises at least two vertically stacked electronic components having a total vertical thickness being larger than a vertical thickness of the core.

5. The component carrier according to claim 1, wherein the at least one electronic component is covered at the sidewalls and at the upper main surface by the electrically insulating sheet.

6. The component carrier according to claim 1, further comprising:
a further electrically insulating layer structure formed on top of the sheet.

7. The component carrier according to claim 6, wherein the further electrically insulating layer structure and the other electrically insulating layer structure are made of the same material.

8. The component carrier according to claim 6, wherein the sheet, the further electrically insulating layer structure and the other electrically insulating layer structure have substantially the same coefficient of thermal expansion.

9. The component carrier according to claim 6, wherein the sheet, the further electrically insulating layer structure and the other electrically insulating layer structure have a coefficient of thermal expansion of less than 20 ppm/° C.

10. The component carrier according to claim 1, wherein the electrically insulating sheet is an adhesive sheet selected from the group consisting of resin, prepreg and Resin Coated Copper.

11. The component carrier according to claim wherein the further electrically insulating layer structure comprises at least part of at least one of prepreg and Resin Coated Copper.

12. The component carrier according to claim 1, wherein the core comprises at least one electrically conductive vertical through connection made of copper.

13. The component carrier according to claim 1, comprising at least one of the following features:
the core comprises a fully cured dielectric;
a build-up on an upper main surface of the sheet is substantially symmetrical to another build-up on a lower main surface of the core, the at least one electronic component and the sheet;
the recess is free of an adhesive material.

14. The component carrier according to claim 1, comprising an adhesive material in the recess between at least part of the at least one electronic component and the core.

15. The component carrier according to claim 1, comprising at least one of the following features:
at least one electrically conductive layer structure laminated on and/or within the component carrier;
the at least one electrically conductive layer structure comprises at least one of the group consisting of copper, aluminum, and nickel;
at least one of the sheet and the another electrically insulating layer structure comprises at least one of the group consisting of resin, Bismaleimide-Triazine resin, cyanate ester, glass, glass fibers, prepreg material, polyimide, polyamide, polytetrafluoroethylene, liquid crystal polymer, epoxy-based Build-Up Film, FR4 material, FR5 material, a ceramic, and a metal oxide;
the component carrier is shaped as a plate;
the component carrier is configured as one of the group consisting of a printed circuit board, and a substrate;
the electronic component is selected from a group consisting of an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, a sensor, an actuator, a microelectromechanical system, a microprocessor, a capacitor, a resistor, an inductance, a battery, a switch, a camera, an antenna, a magnetic element and a logic chip;
the component carrier is configured as a laminate-type component carrier.

16. A method of manufacturing a component carrier, the method comprising:
providing a core having a recess;
arranging at least one an electronic component in the recess, wherein a vertical thickness of the at least one electronic component is larger than a vertical thickness of the core;
connecting an electrically insulating sheet to the core and the at least one electronic component so that material of the sheet covers at least part of the core and of the at least one electronic component and fills a gap between a lateral surface of the at least one electronic component and a lateral surface of the core in the recess; and
laminating another electrically insulating layer structure on a bottom of the core and on a bottom of the at least one electronic component, wherein the another electrically insulating layer structure comprises a fully cured core material;
wherein a bottom main surface of the at least one electronic component is flush with a bottom main surface of the core;
wherein the electronic component comprises one or more pads at the bottom main surface; and
wherein at least one via is formed through the another electrically insulating layer structure to electrically contact the pad of the electronic component.

17. The method according to claim 16, comprising:
connecting a further electrically insulating layer structure on top of the sheet.

18. The method according to claim 16, comprising at least one of the following features:
the at least one electronic component is arranged in the recess so that a bottom main surface of the at least one electronic component is aligned with a bottom main surface of the core;
the sheet is provided as a continuous layer to cover also an upper surface of the at least one electronic component, wherein the sheet has a blind hole type indentation at the position of and a main surface facing the at least one electronic component;
the sheet is provided as a recessed layer having a recess to accommodate an upper portion of the at least one electronic component;
laminating an adhesive tape to the core before arranging the at least one electronic component in the core and adhering the at least one electronic component to the adhesive tape, wherein the method further comprises removing the adhesive tape after laminating the sheet;
the further electrically insulating layer structure is a further core.

* * * * *